(12) United States Patent
Ravkin et al.

(10) Patent No.: US 6,200,201 B1
(45) Date of Patent: Mar. 13, 2001

(54) CLEANING/BUFFER APPARATUS FOR USE IN A WAFER PROCESSING DEVICE

(75) Inventors: Mikhael Ravkin, Sunnyvale; John M. deLarios, Palo Alto; Xiuhua Zhang, San Jose; Thomas R. Gockel, Modesto, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/009,583

(22) Filed: Jan. 20, 1998

Related U.S. Application Data

(63) Continuation-in-part of application No. 08/705,161, filed on Aug. 29, 1996, now abandoned.

(51) Int. Cl.[7] .................... B24B 7/00; B24B 9/00
(52) U.S. Cl. ................. 451/65; 451/285; 451/287
(58) Field of Search ............... 15/77, 21.1, 88.3; 134/902; 364/468.2; 451/41, 285, 287, 288, 103, 108, 110, 112, 65

(56) References Cited

U.S. PATENT DOCUMENTS

| 4,141,180 | * | 2/1979 | Gill, Jr. et al. | 451/67 |
|---|---|---|---|---|
| 4,586,296 | * | 5/1986 | Saunders | 451/269 |
| 4,680,893 | * | 7/1987 | Cronkhite et al. | 451/285 |
| 5,121,572 | * | 6/1992 | Hilscher | 451/262 |
| 5,140,774 | * | 8/1992 | Onodera | 451/269 |
| 5,551,986 | | 9/1996 | Jain . | |
| 5,555,177 | | 9/1996 | Simmons . | |
| 5,704,987 | | 1/1998 | Huynh et al. . | |
| 5,794,299 | | 8/1998 | Gockel et al. . | |
| 5,809,832 | | 9/1998 | Gockel et al. . | |

FOREIGN PATENT DOCUMENTS

| 0677867A2 | 10/1994 | (EP) . |
|---|---|---|
| 0 677 867 A2 | 11/1994 | (EP) . |

* cited by examiner

*Primary Examiner*—Derris H. Banks
(74) *Attorney, Agent, or Firm*—Martine Penilla & Kim, LLP

(57) ABSTRACT

A semiconductor processing system, such as a system for buffing or scrubbing both sides of a wafer at the same time, that includes a processing box for use with chemical solutions, a positioning device to position a semiconductor substrate, or other similar semiconductor material or device, and a placement device to place a buffing pad or scrubbing brush.

18 Claims, 6 Drawing Sheets

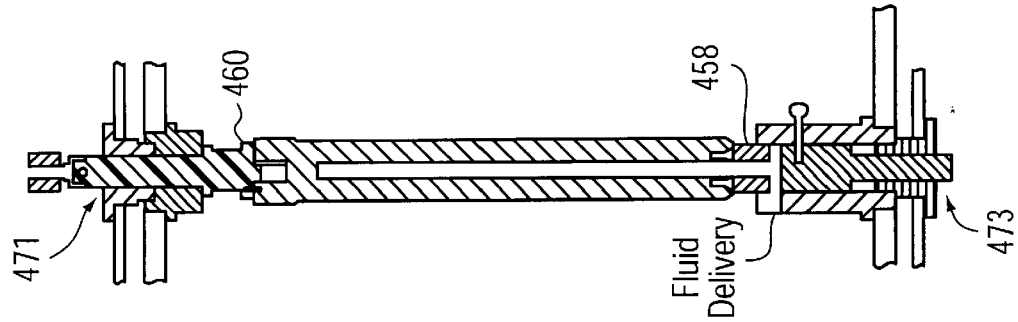
FIG. 4D
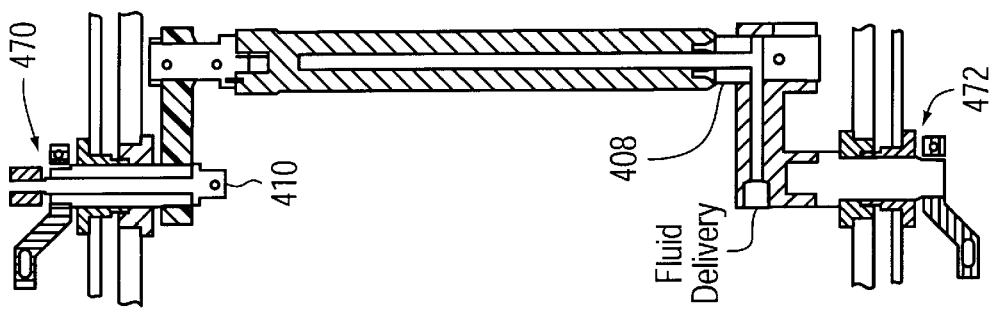
FIG. 4C
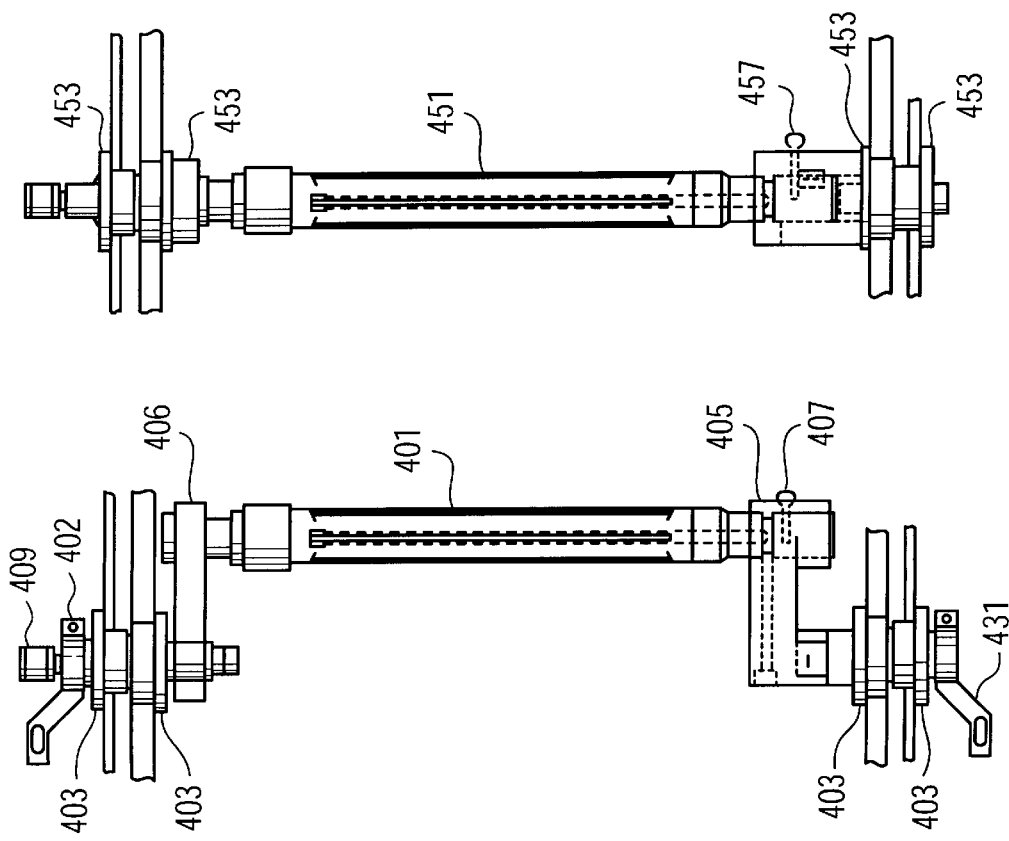
FIG. 4B
FIG. 4A

CLEANING/BUFFER APPARATUS FOR USE IN A WAFER PROCESSING DEVICE

This is a continuation-in-part application of application Ser. No. 08/705,161 entitled, "A Brush Assembling Apparatus," filed Aug. 29, 1996, now abandoned, assigned to the corporate assignee of the present invention.

FIELD OF THE INVENTION

The present invention relates to semiconductor wafer processing; particularly, the present invention relates to an apparatus for use in buffing and cleaning semiconductor wafers.

BACKGROUND OF THE INVENTION

Chemical mechanical polishing (CMP) in the semiconductor industry is typically used to planarize the surface of a dielectric film or to remove excess metal film deposited on a substrate or previous film. To perform planarization, a relatively hard pad material is used such as polyurethane with special filler material. To provide global (within wafer) planarization, a softer under layer is generally used. The effectiveness of a planarization process strongly depends on the hardness of the polishing pad which removes the high spots of a dielectric film in the presence of a polishing slurry. Therefore, since the planarization is a primary objective for performing CMP, hard pads are generally used. This planarization step is referred to as the primary or first polishing step.

Unfortunately, a hard polishing pad is not favorable for achieving low defects on the polished surface. Therefore, a second platen (polishing table) is used with a softer polishing pad either to polish off small amount of material after the primary polishing step or to simply "clean" the surface of the wafer prior to the cleaning system. This "cleaning" step on the separate polishing table uses DI water and is often called buffing. The separate polishing table on the polishing machine adds complexity, reduces throughput and increases the footprint of the polishing tool. It is desirable to perform all wafer cleaning operations outside the polisher to avoid these disadvantages.

Regular wafer scrubbing systems can successfully remove loose slurry particles from the surface of the wafer and some scrubbing systems can remove metallic contamination from the wafer surface. Regular scrubbers are not effective in removing small slurry particles that are often embedded into the film. Normally buffing on the soft polishing pad removes the majority of such defects leaving the polished surface sufficiently clean and prepared for scrubbing.

It is therefore desirable to enhance scrubber performance and clean wafers after the primary CMP step to provide the same defect level as the two step CMIP process, specifically: primary polishing step plus the buffing step.

The prior art wafer scrubbing systems have not been adapted for buffing operation because the pressure and speed of the buffing media was significantly lower than it is required for buffing. Some of the scrubbing systems do not lend themselves to perform buffing because the wafer is being held by the edge and inducing the typical for buffing pressure may break the wafer.

The present invention provides an improved wafer cleaning system specifically designed to perform a buffing operation. The system allows wafers to be processed with a scrubber with significantly increased pressures and speeds broadening the range of applications. The apparatus also allows control and change of processing parameters to perform buffing or regular scrubbing in the same or separate stations when applying suitable chemicals.

SUMMARY OF THE INVENTION

A system for processing semiconductor wafers is described. The system includes a buffing station and a scrubbing station coupled to the buffing station.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIGS. 4A–4D illustrate a top views of embodiments of the upper and lower brush assemblies and section views of the upper and lower brush assemblies respectively.

DETAILED DESCRIPTION OF THE PRESENT INVENTION

Figure 1:
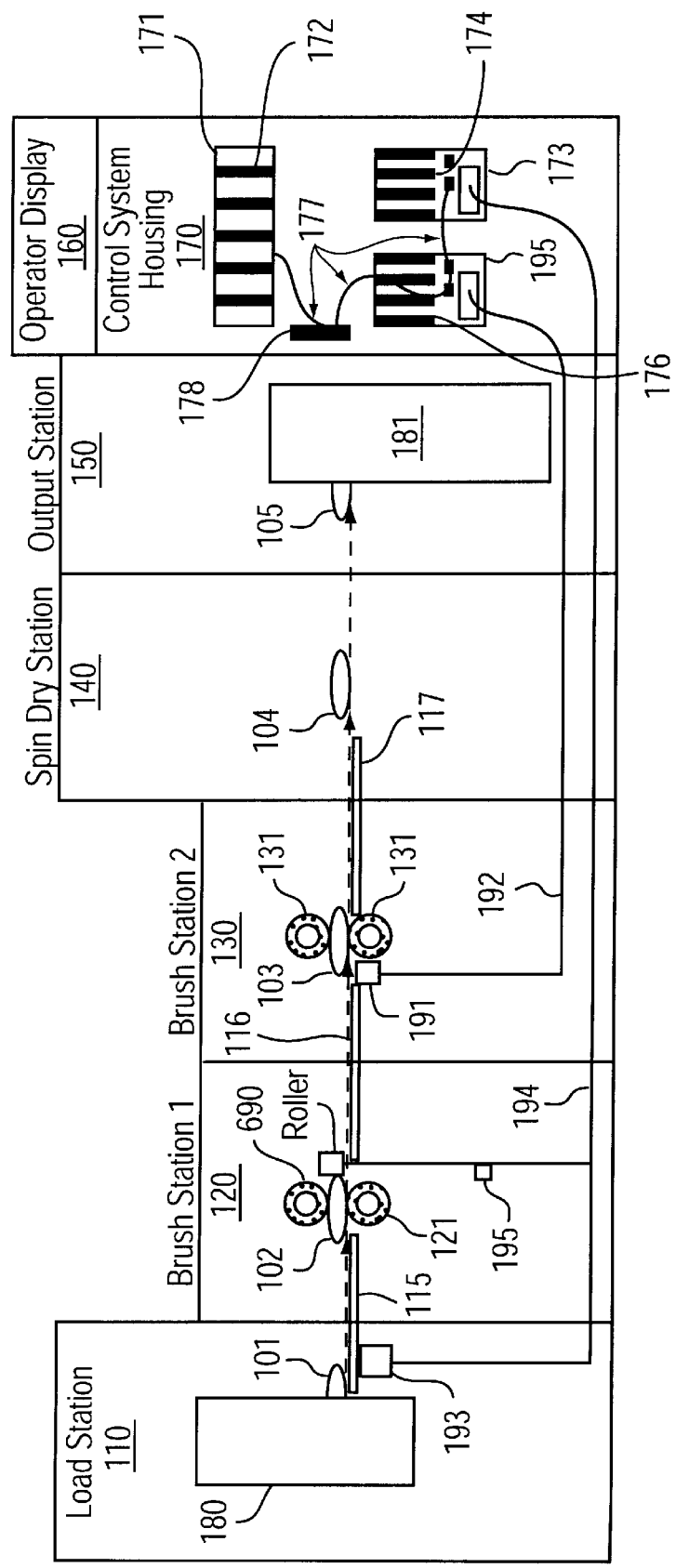
FIG. 1 illustrates an exemplary scrubber system.

A system for processing semiconductor wafers is described. In the following description, numerous details are set forth, such as component materials, speeds, pressures etc. It will be apparent, however, to one skilled in the art, that the present invention may be practiced without these specific details. In other instances, well-known structures and devices are shown in block diagram form, rather than in detail, in order to avoid obscuring the present invention.

Overview of the Present Invention

While the process sequence for the typical polishing system with more than one platen consists of one or two primary polishing steps on a platen with a hard pad and a buffing operation on a platen with a soft pad, the new proposed process sequence of the present invention performs only primary polishing steps on the polisher and the buffing operation is performed on the scrubber with the enhanced performance. This process sequence will allow to significantly increase polisher throughput and use the buffing platen to perform primary polishing.

For the polishing systems with a single platen this configuration of the scrubber will allow to produce higher quality (lower defects) wafers than currently possible.

Such an enhancement will unload the burden of the cleaning step from the polisher to the cleaning system (scrubber) where it is quite natural to perform cleaning operations. Furthermore, the scrubber environment is better suited for performing cleaning operation than a polisher due to the use of a clean enclosed process chamber and the ability to handle different chemicals. Another advantage of performing the buffing step on the scrubber is that both sides of the wafer may be buffed simultaneously when only the front side is being buffed on the polisher.

The present invention provides a system for processing semiconductor wafers. In one embodiment, the system includes a buffing station and a scrubbing station. In one embodiment, the buffing station buffs two (e.g., opposite, etc.) sides of a wafer simultaneously. In one embodiment, the buffing station buffs opposite sides of a wafer simultaneously and the scrubbing station performs brush scrubbing of the opposite sides of the wafer simultaneously after buffing of the wafer has been completed.

In one embodiment, the buffing station includes one or more buffing elements, at least one of which is positioned by a first assembly. Similarly, the scrubbing station includes one or more scrubbing elements, at least one of which is positioned by a second assembly, where portions of the first and second assemblies are substantially the same. The buffing and scrubbing elements are processing elements that may comprise pads and/or brushes.

In one embodiment, the buffing station is configurable to be another scrubbing station, such as a brush scrubbing station. In one embodiment, the buffing station includes an assembly configurable to apply a processing element, which may be a brush or a pad or other buffing media, to a semiconductor wafer at various pressures. These various pressures may include a first set of pressures sufficient to scrub a semiconductor wafer and a second set of pressures sufficient to buff the semiconductor wafer. Whether performing scrubbing or buffing in the same station at different times, suitable chemicals still must be applied, where necessary.

A buffing element or a buffing media may be composed of a single layer of PVA material or of a multiple layers of different materials. In one embodiment, the buffing (or processing) element is composed of a hard, chemically resistant material such as PET plastic with a PVA material layer on top of it and soft polishing pad wrapped around the PVA layer. This configuration allows significant pressure to be applied to the wafer during a buffing process, has relatively large pad to wafer contact area and maintains compatibility of the process element with the standard scrubber configuration. The processing element in contact with the back side of the wafer may be exactly the same or composed of a standard core and PVA brush typical for a scrubber.

Application of the pressure during buffing cycle is accomplished by moving the upper processing element relative to the stationary lower processing element along the vertical axis. See FIG. 2 and the discussion below. The wafer is positioned between processing elements and may take significant loads without breaking.

The present invention provides a processing box that includes a brush or pad assembly and a positioning assembly. The brush/pad assembly comprises a pair of pads and/or brushes for buffing and/or cleaning wafers and a mechanism to control and drive the brushes and/or pads. The positioning assembly of the present invention may be used to position various components and devices in a processing system. In one embodiment, such components include wafer handling and manipulation devices, such as rollers, wheels, guides, one or more robots. For example, see U.S. patent application Ser. No. 08/705,115, entitled "A Containment Apparatus," filed Aug. 29, 1996; U.S. patent application Ser. No. 08/705,162, entitled "A Roller Positioning Apparatus," filed Aug. 29, 1996; and U.S. patent application Ser. No. 08/705,161, entitled "A Brush Assembly Apparatus," filed Aug. 29, 1996, all assigned to the corporate assignee of the present invention.

The processing box of the present invention may be incorporated into a wafer processing system having multiple processing stations. For instance, the wafer processing system may have one or more stations for buffing and/or cleaning (e.g., scrubbing) substrates. Note that although the present invention may be described in terms of cleaning by performing brush scrubbing of wafers, wafer cleaning techniques other than scrubbing may be employed in one or more of the processing stations.

Although the present invention is described in conjunction with buffing and scrubbing a wafer, it will be appreciated that any similarly shaped, i.e. generally applied substrate, may be processed by the present invention. Further, it will be appreciated that reference to a wafer or substrate may include a bare or pure semiconductor substrate with or without doping, a semiconductor substrate with epitaxial layers, a semiconductor substrate incorporating one or more device layers at any stage of processing, or other types of substrates incorporating one or more semiconductor layers such as substrates having semiconductor-on-insulator (SOI) devices or substrates for processing other apparatuses and devices, such as flat panel displays, hard disks, multi-chip modules, etc.

The present invention provides for a brush/pad assembly that is capable of operating at high energy (high pressure and high speed) compared to standard scrubbing. The system of the present invention performs with higher pressures than those typically used in prior art scrubbers. In the present invention, when buffing, the system operates at a down pressure, or down force, of 0.1–4 psi (approximately 0.2–20 lbs.) and at a relative speed of approximately 40–120 feet per minute. In contrast, the standard scrubber operates at a pressure of approximately 0.1–0.5 psi (0.2–1 lbs.) and at a relative speed of 5–20 feet per minute. Note that the typical prior art polishers operate with a down pressure of 2–4 PSI (100 lbs.) at a relative speed of 160–250 feet per minute to perform a buffing operation.

An Exemplary System

FIG. 1 illustrates a conceptual view of a double sided wafer buffer and scrubber system as may be used by one embodiment of the present invention. The system includes a number of stations. Each of theses stations logically represent one or more steps in the wafer buffing and cleaning process. These stations can also include the hardware and software that completes one of the steps in the process. The process includes the steps executed by the system on the wafers. In one embodiment, the system can process multiple wafers simultaneously; one or more wafers are being processed in each of the stations at a point in time.

In one embodiment, the present invention provides an acidic (low pH) cleaning process for wafers. The cleaning process may comprise a hydrofluoric (HF) cleaning process. In order to withstand the corrosive effects of the acid, plastic components in the system may be comprised of such materials such as PET, acetal (DELRIN), teflon, polypropylene (polypro), polyuerethane, etc., and metal components may comprise stainless steel, such as Hastelloy $C_{276}$. Note that the present invention may be applied to other cleaning processes and systems.

It should be noted that the brush assembly of the present invention operates on a processing box that may facilitate the use of dionized (DI) water in the process. In one embodiment, the processing box of the present invention is fully capable of running different chemistries. For instance, hydrofluoric acid (HF) may be run in the processing box of the present invention. Importantly, the present invention provides the ability to apply pressure similar to a polisher and still process all the chemicals for cleaning.

Dirty wafers are loaded at one end of the scrubber; clean wafers are unloaded from the other end of the scrubber.

In load station 110 (also known as the input station), the operator loads a cassette 180 into the scrubber. The cassette 180 contains a number of dirty wafers. Wafers are automatically moved from load station 110 to station 120 on transport belt 115. Transport belt 115 is moved by DC motor 193. Wafer 101 represents a dirty wafer being automatically removed from cassette 180 and placed on transport belt 115.

Station 120 may be configured as a buffer to buff wafers as part of a buffing process or may be configured to clean the wafer as part of a cleaning process. When configured as a buffing station (as part of a buffing process), station 120 buffs and sprays (water jets not shown) a polished wafer to remove some of particles from polished wafer 102. Pads 121 buff both sides of the polished wafer 102 at the same time. The height of the top brush is controlled by a stepper motor (not shown). Roller 190 rotates polished wafer 102.

When configured as a brush station (as part of a cleaning process), in station 120, a dirty wafer 102 is brushed and sprayed (water jets not shown), to remove some of the particles from the dirty wafer 102. Brushes 121 scrub both sides of the dirty wafer 102. The position of the top brush is controlled by a stepper motor (not shown). Roller 190 rotates dirty wafer 102. In one embodiment, the edge and bevel areas of a wafer are cleaned using the roller. Enhanced cleaning may be obtained when there is a differential velocity difference between the roller and the wafer.

The buffed or once brushed wafers are then automatically moved to station 130. This is done by transport belt 116, controlled by a second DC motor (not shown).

In station 130, a buffed or once brushed wafer 103 is brushed and sprayed (water jets not shown) to remove more of the particles from wafer 103. Brushes 131 scrub both sides of the once brushed wafer 103. The position of the top brush of brushes 131 are controlled by stepper motor 191. When completed, the twice brushed wafers are then automatically moved to spin & dry station 140, via transport belt 117.

Although the system described above indicates that station 120 may be configured as either a brush station for cleaning a wafer or a buffing station for buffing a wafer, station 130 may also be configured as either a brush station or a buffing station.

Spin & dry station 140 rinses the wafers, spins them, and dries them. Wafer 104 represents a wafer being processed in the spin & dry station 140. At this point, the wafer has been cleaned. Note, for one particular type of wafer, the wafer must have been kept wet during the load station 110, station 120, and station 130. Only after being brushed and rinsed can this type of wafer then be spun and dried. The spun and dried wafer is then moved to the output station 150.

In output station 150, the clean wafer is put into a cassette 181. Wafer 105 represents a clean wafer being put into cassette 181. The cassette 181, when full of clean wafers, can then be removed by the operator. This completes the cleaning process.

Control system housing 170 houses a number of components that comprise the heart of the control system for the scrubber. Control system housing 170 includes a host cage 171 having a host board 172. The host board 172 provides the overall control for the scrubber. The host board 172 typically includes one or more host processors implemented in one or more physical packages. The host cage 171 provides support for the host board 172 and other boards in the host cage (e.g., sensor input boards, a video card for operator display 160, a board for communicating signals from the host board 172 to the rest of the control system).

Figure 2:
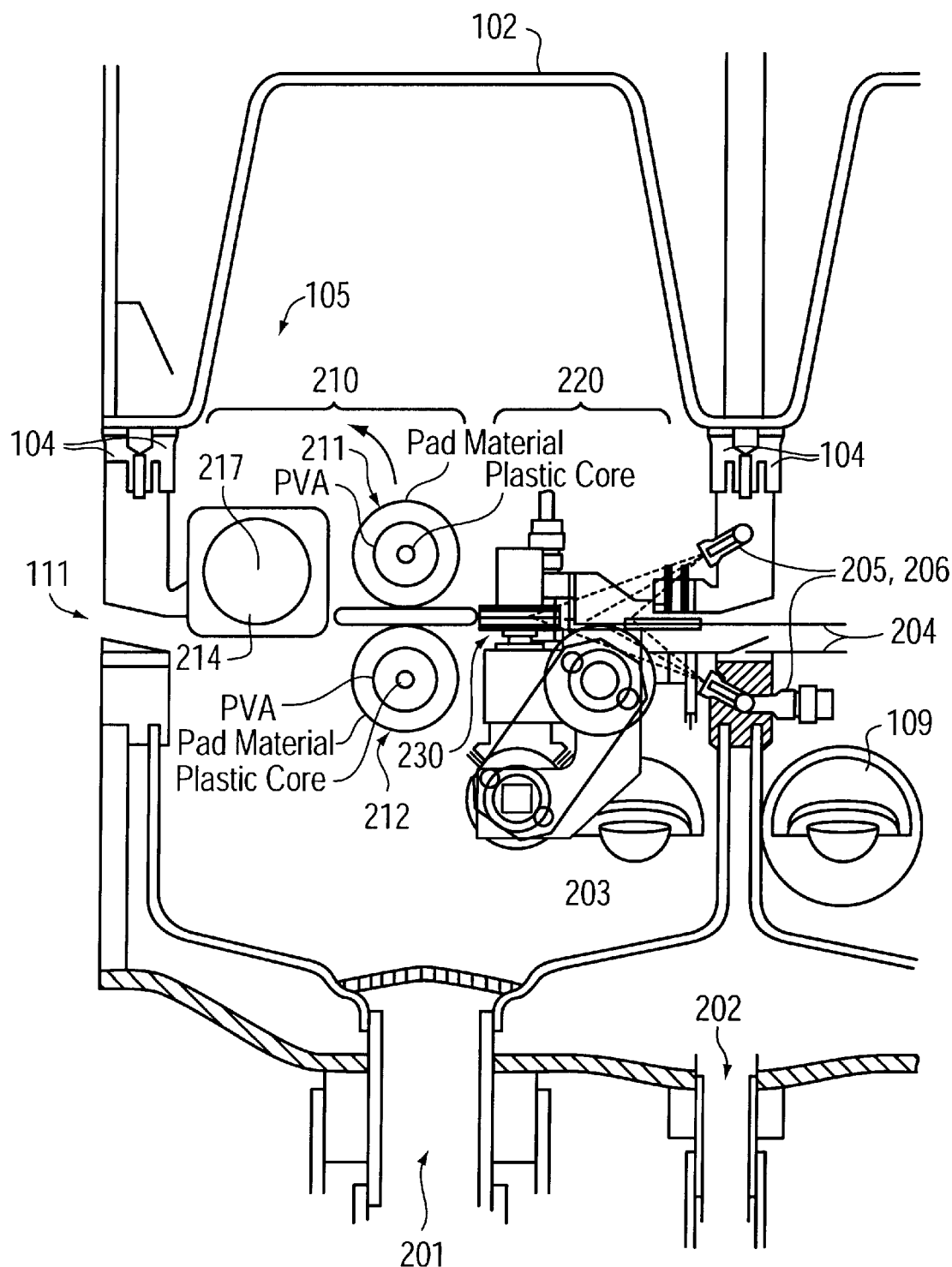
FIG. 2 illustrates a side view of one embodiment of a brush box and a portion of the brush box containment apparatus.

FIG. 2 illustrates a side view of brush box 105. Note the brush box 106 is substantially similar. Referring to FIG. 2, brush box 105 is shown to contain a brush assembly 210 comprising scrubbing brushes 211 and 212 for scrubbing both sides of a wafer at the same time and a brush drive mechanism 214 with a brush pivot point 213, as are described in more detail below. The brush drive mechanism 214 is coupled to drive brush 211 and is described in greater detail below.

Note that brush box 105 also includes inner chamber drain 201. Also shown is outer chamber drain 202 which corresponds to a drain in base container 113. Brush box 105 also includes an exhaust pipe 203 as described above. All drains include seals, which are well-known in the art. Each seal may include a leak detection apparatus. In one embodiment, the outer chamber drain 202 is comprised of polypro.

Brush box 105 also includes inlet 111. Inlet 111 allows passage of wafers to its interior. Brush box 105 is also shown incorporating spray heads 205 and 206 to spray cleaning solutions onto the rollers, such as roller 230 and onto wafers as they exit brush box 105. In one embodiment, spray heads are mounted at the entrance and exit of brush box 105 and at the exit of brush box 106. In an alternative embodiment, spray heads could be mounted at the entrance of brush box 106. The use of spray heads and jets are well-known in the art.

Brush box 105 also contains roller positioning assembly 220 which positions rollers, such as a roller 230, with respect to the wafer that is being cleaned between brushes 211 and 212. In one embodiment, each of brushes 211 and 212 comprises a plastic core and a PVA section covered with pad material. Embodiments of the roller positioning assembly 220 will be discussed in detail below.

It should be noted, as shown in FIG. 2, there are no penetrations apart from exhaust and drains through the bottom of the chamber. The penetrations through the chamber are at the sides. By having only side penetrations, less seals are required and the potential for leaks is reduced, which is particularly advantageous in systems employing highly-acidic chemicals.

Brush Assembly

Figure 3A:
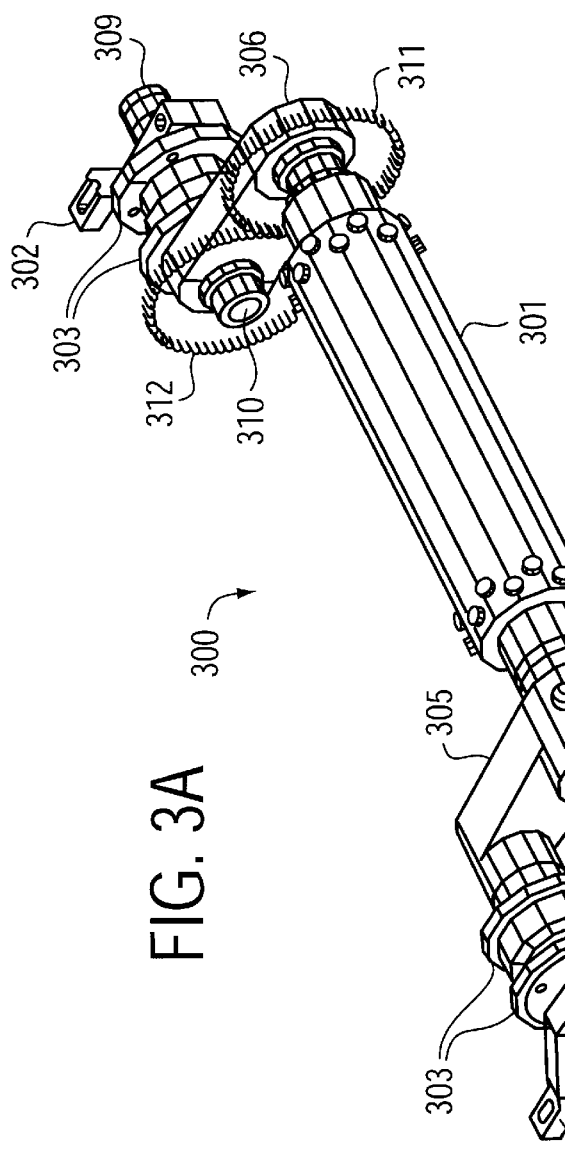
FIG. 3A illustrates a perspective view of one embodiment of the upper brush assembly of the present invention.
Figure 3B:
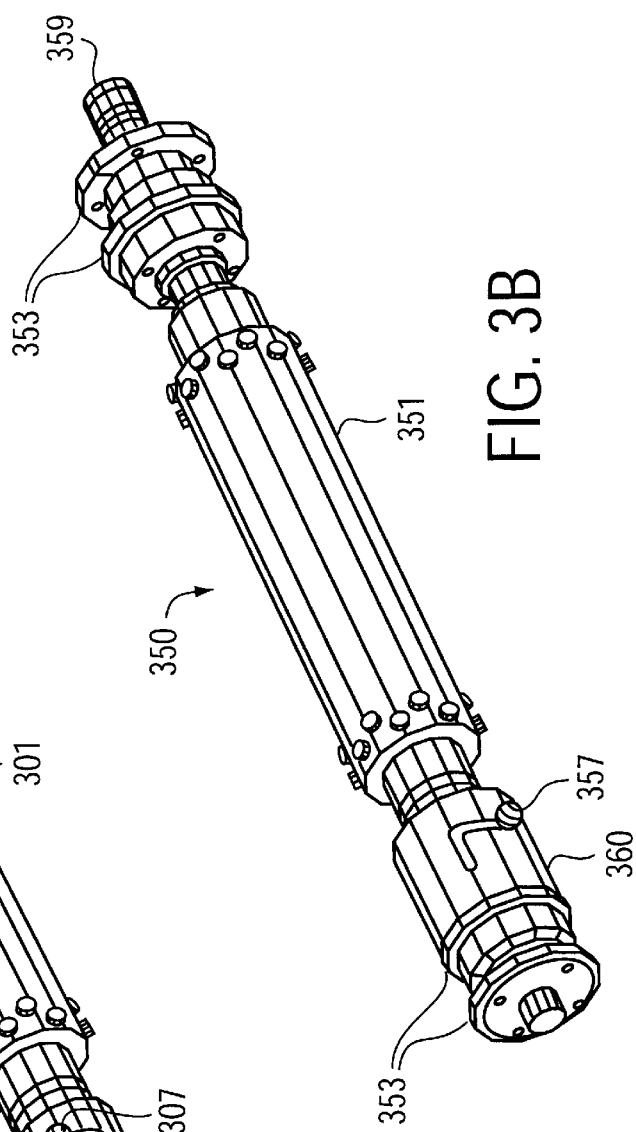
FIG. 3B illustrates a perspective view of one embodiment of the lower brush assembly of the present invention.

FIG. 3A and 3B illustrates perspective views of the upper brush assembly and the lower brush assembly respectively of the brush assembly 510. FIGS. 4A–4D illustrate a top view of the upper and lower brush assemblies and a section view of the upper and lower brush assemblies respectively. It should be noted that the actual brushes themselves (apart from the drive mechanism) are well-known in the art. Note that FIGS. 3A and 3B and FIGS. 4A–4D are described in terms of brushes, however, the assemblies may be configured for pads for buffing, scrubbing, or other processing. Each brush includes multiple protrusions (not shown) to facilitate the cleaning of wafers. In one embodiment, the upper and lower brushes are configured to provide fluid to the core of the brush to be dispersed to the outside of the brush through the brush surface. Such brushes and fluid delivery system will not be described in detail herein. For descriptions on exemplary brushes and more information on the system for fluid delivery through the brush, see U.S. patent application Ser. No. 08/542,531, entitled "Method and Apparatus for Chemical Delivery Through the Brush," filed Oct. 13, 1995, assigned to the corporate assignee of the present invention.

In FIGS. 3A and 3B and FIGS. 4A and 4D, each of the brush cores may be replaced by a pad roller assembly or other suitable material for buffing of the wafer. In this manner, each of the brush assemblies may be configured as a buffing assembly to buff one or more sights of the wafer. It should be noted that in this case the buffing pad roller assembly much like the brush is designed to disburse fluid from its core to the outside of the pad through the pad surface.

The materials used for the brushes may comprise PVA or polyurethane type of material. The top and bottom brushes may be the same or different materials. In another embodiment, the material comprises a combination of PVA or polyurethane type material with a polishing pad on top. The shape of the brush may be in the form of a round cylinder and in such a case may be a flat PVA brush. In another embodiment, a flat PVA brush may be wrapped with a soft polishing pad.

In another embodiment of a buffing station, a pad assembly comprising one or more substantially flat or plate-like rotating pads may be used to buff a wafer placed on a flat carrier. This configuration may be employed due to the greater pressures associated with some buffing operations. In one embodiment, such a pad assembly may comprise a subaIV or other polishing pad. When using a flat pad, the lower brush might not be necessary. In this case, the wafer may still need to be rotated. However, in this configuration, only one side of a wafer may be processed at a time.

In one embodiment, the present invention controls the contact area that occurs between the brushes and the wafer by selecting materials of different technologies. The position of the brush core and the compressibility of the material determine the contact area and pressure that are applied. Therefore, by selecting a brush or pad with certain compressability with the same brush core, the contact area may be changed.

Referring to 3A, 4A, and 4C, one embodiment of the upper brush is described. Rotating arms 301 and 302 are coupled to and responsive to an upper brush lift drive (one on each side of the brush box) to cause the upper brush assembly 300 to be pivoted towards and away from the wafer. The pivot point about which the upper brush core 301 is rotated is centered upon the axis of rotation of drive shaft 310. The amount of pivot towards the wafer affects the amount of pressure applied to the wafer and is a design choice based on the requests of the cleaning process. Note that this pivot motion is internal to the brush box. During the pivoting operation, the lower brush assembly 350 is stationary (due to its attachment to the brush box and containment walls).

Rotating arm 331 is coupled to upper brush core 301 through the use of a hexagonal shaft, such as hexagonal shaft 304, and link 305. Rotating arm 302 is coupled to the upper brush core 301 through link 306. Rotating arm 302 coaxially rotates about the drive shaft such that rotation of the drive shaft 310 does not cause pivoting of the upper brush. As shown, the rotating arm 302 is coupled to drive shaft feed through 370 that is rotatable itself. In one embodiment, each lift drive comprises a stepper motor (not shown to avoid obscuring the present invention) and operates by pushing up on the end of rotating arms 331 and 302, thereby causing the upper brush core 301 to pivot downwards to the top of a wafer during the cleaning process. When the each drive pulls down, rotating arms 331 and 302 cause upper brush core 301 to pivot away from the wafer. In an alternative embodiment, lift levers may be employed to move upper brush core 301 to and from the wafer surface. Also, by coupling the stepper motor above the rotating arms, the pivoting of the upper brush assembly 300 may be performed except with control exerted in opposite directions.

Figure 5:
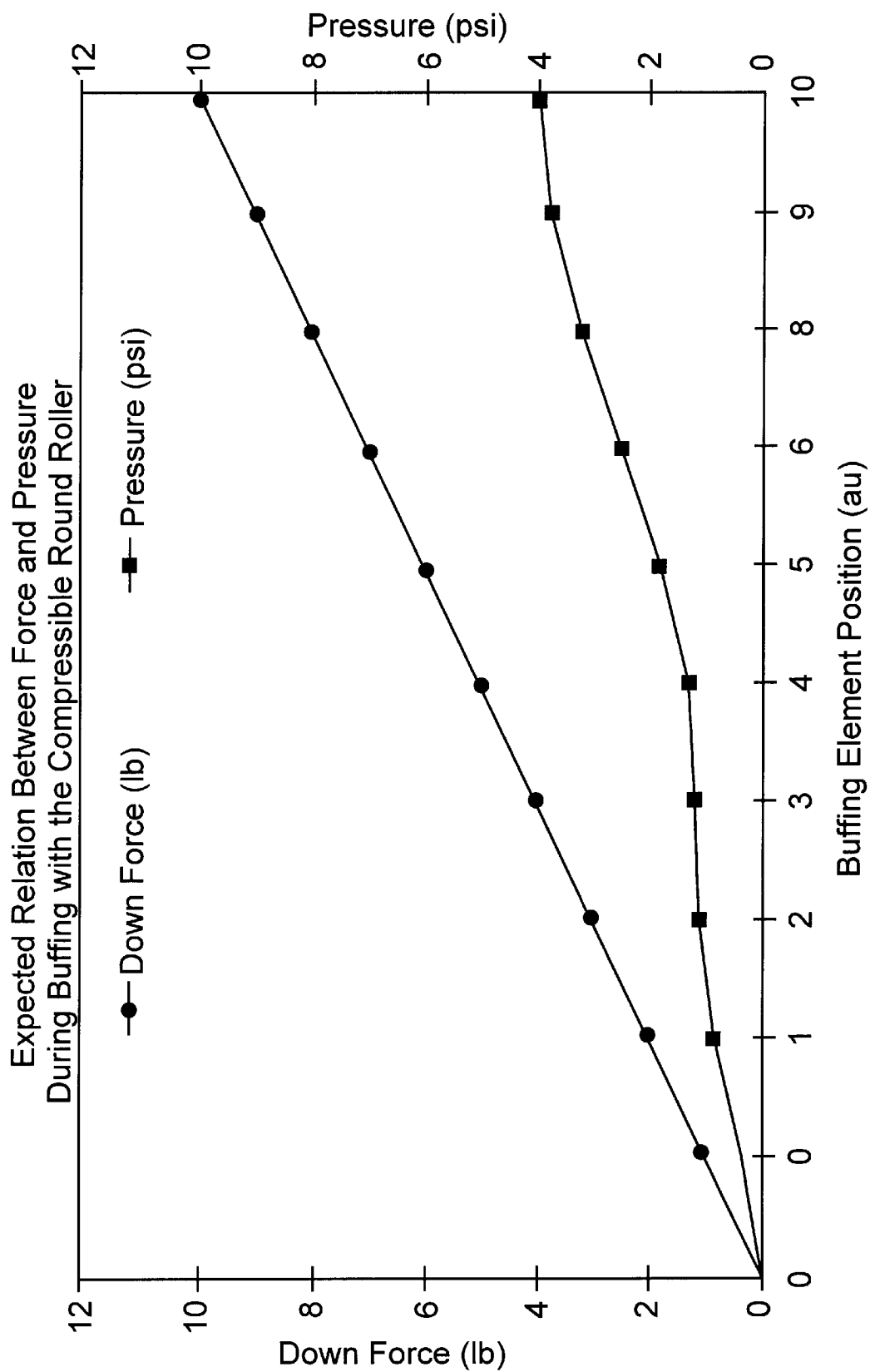
FIG. 5 is a graph illustrating the pressure that the brush may apply to the wafer.

The brush positioning apparatus that causes the brush core 301 to be applied to the wafer may be controlled to apply the brush core 301 to the wafer at various pressures. In other words, the brushes are physically attached so that they may be physically moved (pushed down), as opposed to gravity based movement of the prior art. By pushing up on the end of the rotating arms 331 and 302 with greater force from the stepper motor, the brush core 301 is applied to the wafer with increased pressure. The increase in pressure is because of the mechanical ratios. FIG. 5 is a graph illustrating the pressure at which a brush core is applied to an 8" wafer using a stepper motor when positioning a brush core in a prior art system and in the present invention. The microsteps of the present invention produce greater brush movement than in the prior art. As illustrated, the amount of pressure that may be applied is greater than that of the prior art, even 4–5 times greater. The increased pressure applied by the present invention allows removal of embedded particles on the wafer during scrubbing. Using the HF-based process, in conjunction with the increased pressure, provides an overall better cleaning process.

It should be noted that when the brush assembly is used for scrubbing (cleaning), it may be configured to buff the wafer or a partial surface. Furthermore, the present invention may be adapted to provide buffing on only one side of the substrate. However, it should be noted that different from the prior art, the present invention provides for buffing on both sides of a substrate simultaneously.

Thus, the brush assembly of the present invention provides pressure suitable for a buffing system. Therefore, the present invention allows a processing system to be a dual buffing/cleaning system in which the first set of "brush" boxes (one or more) in the containment are used for buffing and the later brush boxes (one or more) are used for scrubbing wafers.

Figure 3C:
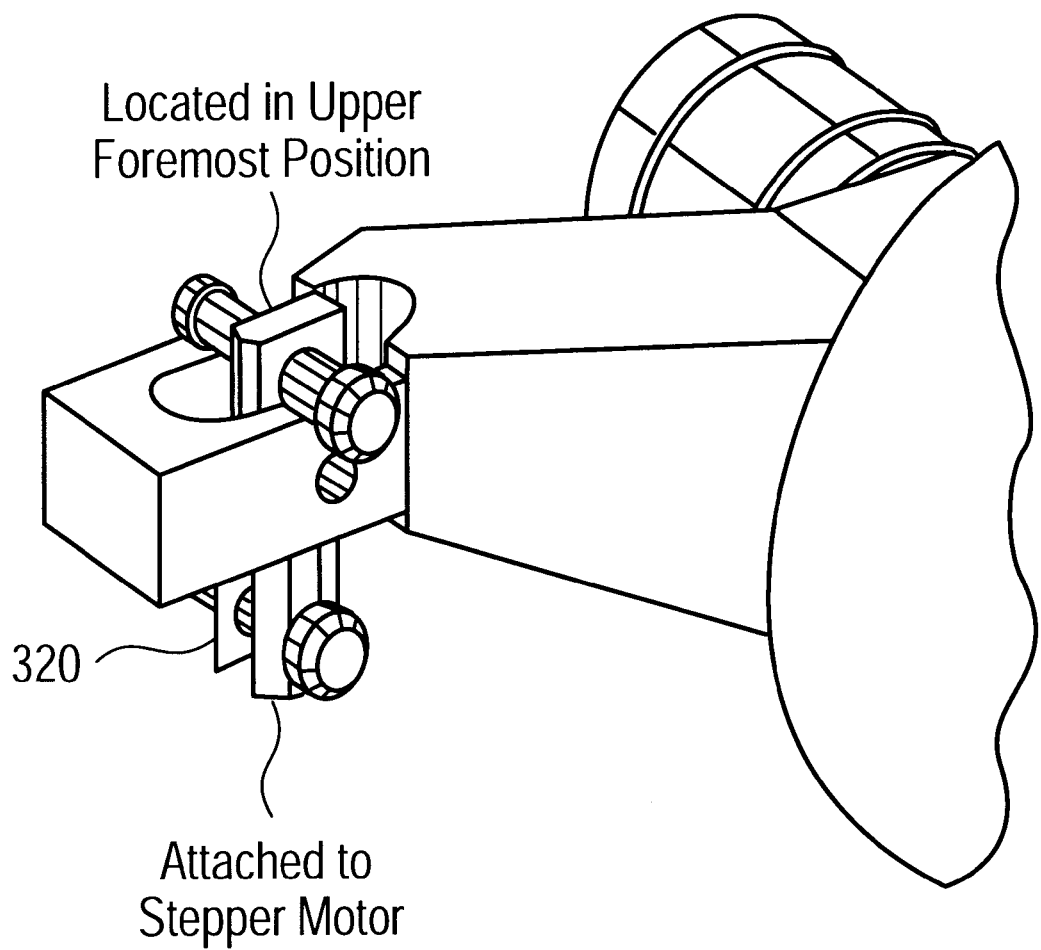
FIG. 3C illustrates one embodiment of a rotating arm and its coupling for attachment to a drive.

FIG. 3C illustrates one of the rotating arms 331 and 302 and its coupler 320 to a stepper drive, which is positioned for operation below the rotating arm. When the coupler 320 is in the upper most position, the brush core 301 is being applied to the wafer, while in the lower most position, the brush core 301 pivots away from the wafer. If the stepper motor is positioned above the rotating arm, the movement of the coupler 320 would be reversed to obtain the same brush core movement.

Sets of penetration bushings 303 are used to maintain the position of shaft feed throughs 370 and 372, and the upper brush assembly 300, with respect to the brush container 113 and secure upper brush assembly 300 to side of the brush box. In this manner, the penetration bushing 303 are used as part of the coupling of the upper brush assembly 300 to the brush box and brush container 113. Furthermore, the bearing units into the brush box may be used for added stability. That is, the bearing units must support the higher loads and speeds.

Penetration bushings 303 also acts as seals between the inner cavity of the brush box and the exterior of the brush box containment apparatus. The use of penetration bushings is well-known in the art. In one embodiment, the penetration bushings are made of T-500, made by IGUS, Inc. of East Providence, RI.

Separate links 305 and 306 are used to couple the drive section and rotating arms of the brush assembly 300 to its brush core 301.

Flex coupler 309 is used to couple drive shaft 310 to a motor (not shown) that drives the upper brush core 301, causing it to rotate. In one embodiment, the flex coupler 309 is coupled to drive shaft 310 via a stainless steel (or other acid resistant material) shaft reducer.

The rotation motion which the motor applies to drive shaft 310 is applied to the brush core 301 through a set of gears.

(Note that shaft feed throughs for both the upper brush assembly 300 and the lower brush assembly allow the drive shafts 310 and 360 to freely rotate in response to activation of their drive motors.) Idler gear 312 is coupled to drive shaft 310. Drive gear 311 is coupled to the brush core 301. Idler gear 312 and drive gear 311 contact each other through their teeth. When drive shaft 310 is rotated, idler gear 312 rotates. The rotation motion of idler gear 312 is then transferred to drive gear 311 in a manner well-known in the art. It should be noted that the size of the gear is a design choice. In one embodiment, idler gear 312 and drive gear 311 each have 66 teeth and have pitch of 24, and a diameter of 2.75 inches.

The size of the idler gear and the drive gear with respect to each other may be changed. This change in their ratio may be beneficial to give different differential speeds. Such different speeds may be important for edge cleaning purposes with spin rollers. Also note that although gears are shown to drive upper brush assembly 300, gears may be replaced by belts.

In one embodiment, a gear guard is used to cover the gears to prevent particles from the cleaning process from getting into the gears and to prevent particles created by the gears from contaminating the wafers.

Retracting pin 307 is coupled to retracting core 308 near one end of the brush core 301. The present invention provides retracting pins 307 and retracting core 308 to allow for easy removal of the brush core 301. In this manner, the brush core 301 may be removed for maintenance and repair. When retracting pin 307 is moved downward and to the left from its position in FIG. 3A, the retracting core 308 which partially disposed within the brush core 301 is pulled outside of brush core 301. The amount that retracting core 308 is pulled out from brush core 301 allows the brush core 301 to be freed from link 305. Such movement moves the other end of brush core 301 away from link 306, which extends to partially within brush core 301. Once at this position, the brush core 301 may be extracted from the brush box.

Referring back to FIGS. 3B, 4B and 4D, lower brush assembly 350 is similar to upper brush assembly 300, in that it includes a brush core 351 and a penetration bushings 353 to secure the lower brush assembly 350 to the brush box and brush container 113. A flex coupler 359 is coupled to a drive shaft 360. The flex coupler 359 couples a drive motor to the drive shaft 360 to drive the lower brush core 351.

Lower brush assembly 350 also includes a retracting pin 357, which operates similarly to retracting pin 307 by extracting a retracting core 358 from being disposed within brush core 351, thereby allowing brush core 351 to be removed from the brush box.

It should be noted that although lower brush assembly 350 is directly driven by a motor through flex coupler 359, in an alternative embodiment, the lower brush 350 may be driven by the same motor that drives the upper brush 300 through the use of gears. In one embodiment, four gears are used to drive the lower brush core with the same motor that drives the upper brush core. In such an embodiment, a drive gear coupled to the brush core would be driven by an idler gear 312 and/or drive shaft 310. Using only one motor reduces the number of penetrations into the brush box, which is advantageous in highly acidic cleaning processes as described above.

Whereas many alterations and modifications of the present invention will no doubt become apparent to a person of ordinary skill in the art after having read the foregoing description, it is to be understood that the various embodiments shown and described by way of illustration are in no way intended to be considered limiting. Therefore, references to details of various embodiments are not intended to limit the scope of the claims which in themselves recite only those features regarded as essential to the invention.

Thus, a scrubbing/buffing assembly apparatus has been described.

We claim:

1. A system for processing semiconductor wafers comprising:
   a buffing station, wherein the buffing station buffs opposite sides of a wafer simultaneously; and
   a scrubbing station coupled to the buffing station.

2. A system for processing semiconductor wafers comprising:
   a buffing station; and
   a scrubbing station coupled to the buffing station, wherein the buffing station buffs opposite sides of a wafer simultaneously and the scrubbing station performs brush scrubbing of the opposite sides of the wafer simultaneously after buffing of the wafer by the buffing station has been completed.

3. A system for processing semiconductor wafers comprising:
   a buffing station; and
   a scrubbing station coupled to the buffing station, wherein the buffing station is configurable to be another scrubbing station.

4. The system defined in claim 3 wherein the another scrubbing station comprises a brush scrubbing station.

5. A system for processing semiconductor wafers comprising:
   a buffing station, wherein the buffing station comprises at least one buffing element positioned by a first assembly, and wherein the first assembly positions said at least one buffing element with a pressure on a surface of a wafer in a range of approximately 0.1 to 4 psi; and
   a scrubbing station coupled to the buffing station, wherein the scrubbing station comprises at least one scrubbing element positioned by a second assembly, and further wherein portions of the first and second assemblies are substantially the same.

6. A system for processing semiconductor wafers comprising:
   a buffing station, wherein the buffing station comprises at least one buffing element positioned by a first assembly, and wherein the buffing station further comprises a wafer positioning assembly to rotate the buffing element at a speed in a range of approximately 40–120 ft/min; and
   a scrubbing station coupled to the buffing station, wherein the scrubbing station comprises at least one scrubbing element positioned by a second assembly, and further wherein portions of the first and second assemblies are substantially the same.

7. A system for processing semiconductor wafers comprising:
   a buffing station, wherein the buffing station applies at least one buffing element to a wafer with a pressure on a surface of the wafer in a range of approximately 0.1 to 4 psi while rotating the buffing element at a speed in a range of approximately 40 to 120 ft/min; and
   a scrubbing station coupled to the buffing station.

8. An improvement in a system for processing semiconductor wafers, the improvement comprising:
   an assembly configurable to apply a processing element to a semiconductor wafer at a plurality of pressures that include a first set of pressures sufficient to scrub a semiconductor wafer and a second set of pressures sufficient to buff the semiconductor wafer.

9. The improvement defined in claim 8 wherein the processing element comprises a pad.

10. The improvement defined in claim 8 wherein the processing element comprises a brush.

11. The improvement defined in claim 8 wherein the assembly positions the processing element with a pressure on a surface of the semiconductor wafer in a range of approximately 0.1 to 4 psi.

12. The improvement defined in claim 8 wherein the assembly further comprises a wafer positioning assembly to rotate the processing element at a speed in a range of approximately 40–120 ft/min.

13. The improvement defined in claim 8 wherein the assembly applies the processing element to the semiconductor wafer with a pressure on a surface of the semiconductor wafer in a range of approximately 0.1 to 4 psi while rotating the processing element at a speed in a range of approximately 40 to 120 ft/min.

14. A system for processing a semiconductor wafer comprising:
   a buffing assembly comprising
      a container;
      a first pad coupled to the container to buff a first side of the wafer;
      a second pad to buff a second side of the wafer;
      a pad positioning assembly coupled to the container and the second pad to position the second pad with respect to the wafer so as to enable buffing of two sides of the wafer simultaneously by the first and second pads; and
   a scrubbing station coupled to the buffing station.

15. The system defined in claim 14 wherein the scrubbing station comprises at least one scrubbing element positioned by a brush positioning assembly, and further wherein portions of the brush positioning and pad positioning assemblies are substantially the same.

16. The system defined in claim 14 wherein the pad positioning assembly positions the first pad with a pressure on a surface of a wafer in a range of approximately 0.1 to 4 psi.

17. The system defined in claim 14 wherein the buffing station further comprises a wafer positioning assembly to rotate the first pad at a speed in a range of approximately 40–120 ft/min.

18. The system defined in claim 14 wherein the buffing station applies the first pad to the wafer with a pressure on a surface of the wafer in a range of approximately 0.1 to 4 psi while rotating the first pad at a speed in a range of approximately 40 to 120 ft/min.

\* \* \* \* \*